United States Patent
Obermeier et al.

(10) Patent No.: US 6,579,589 B1
(45) Date of Patent: Jun. 17, 2003

(54) SEMICONDUCTOR WAFER WITH CRYSTAL LATTICE DEFECTS, AND PROCESS FOR PRODUCING THIS SEMICONDUCTOR WAFER

(75) Inventors: Günther Obermeier, Kirchweidach (DE); Reinhold Wahlich, Tittmoning (DE); Theresia Bauer, Burgkirchen (DE); Alfred Buchner, Pischelsdorf (AT)

(73) Assignee: Wackersiltronic Gesellschaft fur Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/575,012

(22) Filed: May 19, 2000

(30) Foreign Application Priority Data

May 28, 1999 (DE) .......................... 199 24 649

(51) Int. Cl.[7] ............................................. C30B 29/06
(52) U.S. Cl. .................. 428/64.1; 428/446; 117/928
(58) Field of Search ..................... 428/64.1, 446; 423/348; 117/928, 3

(56) References Cited

U.S. PATENT DOCUMENTS 5,403,406 A * 4/1995 Falster et al. .............. 148/33.2
5,994,761 A * 11/1999 Falster et al. .............. 257/611

FOREIGN PATENT DOCUMENTS

| EP | 0476 480 | 7/1995 |
|----|----------|--------|
| EP | 0 675 524 | 10/1995 |
| WO | 98/38675 | 9/1998 |

OTHER PUBLICATIONS

Pagani, M. et al. "Spatial Variations in Oxygen Precipitation in silicon after high temperature thermal annealing", Appl. Phys. Lett 70 (12) Mar. 24, 1997, pp. 1572–1574.*
W. Zulehner and D. Huber, Czochralski–Grown Silicon, Crystals 8, Springer Verlag Berlin–Heidelberg, 1982.
"Oxygen in Silicon", F. Shimura, Semiconductors and Semimaterials vol. 42, Academic Press, San Diego, 1994.
Vanhellemont et al., J. Appl. Phys. 62, p. 3960, 1987.

* cited by examiner

Primary Examiner—Deborah Jones
Assistant Examiner—Stephen Stein
(74) Attorney, Agent, or Firm—Collard & Roe, P.C.

(57) ABSTRACT

A semiconductor wafer has a front side 1, a back side 2, a top layer 3, a bottom layer 4, an upper inner layer 5 lying below the top layer 3, a lower inner layer 6 lying above the bottom layer 4, a central region 7 between the layers 5 and 6 an uneven distribution of crystal lattice defects. The concentration of the defects exhibits a first maximum ($max_1$) in the central region 7 and a second maximum ($max_2$) in the bottom layer 4.

7 Claims, 3 Drawing Sheets

SEMICONDUCTOR WAFER WITH CRYSTAL LATTICE DEFECTS, AND PROCESS FOR PRODUCING THIS SEMICONDUCTOR WAFER

BACKGROUND OF THE INVENTION

1. Field of the Invention

The present invention relates to a semiconductor wafer with an uneven distribution of crystal lattice defects, and to a process for producing this wafer.

2. The Prior Art

Silicon crystals, in particular for the production of semiconductor wafers, are preferably obtained by pulling a seed crystal from a silicon melt, which is generally provided inside a quartz glass crucible. This so-called Czochralski crucible-pulling process is described in detail in, for example, W. Zulehner and D. Huber, *Czochralski-Grown Silicon, Crystals* 8, Springer Verlag Berlin-Heidelberg 1982.

Due to the reaction of the quartz glass crucible with the molten silicon during the crucible-pulling process, oxygen is included as the dominant impurity in the growing silicon crystal. The concentration of oxygen is usually so high that, after the crystal has cooled, it is in supersaturated form. In subsequent heat treatments, the oxygen is deposited in the form of oxygen precipitates. These precipitates have both advantages and disadvantages. The so-called gettering properties of the oxygen precipitates are an advantage.

This is understood to mean that, for example, metallic impurities in the semiconductor wafer are bonded to the oxygen precipitates. Thus, they are removed from the layer which is close to the surface and is relevant for components. A drawback is that oxygen precipitates in the layer which is close to the surface. This is relevant for components and will interfere with the function of the components which are manufactured on the semiconductor wafer. Consequently, it is desired for a precipitate-free zone, PFZ, also known as a denuded zone, DZ, to be formed in the vicinity of the surface. It is also desired for a high concentration of precipitates to be formed in the interior of the semiconductor wafer, known as the bulk.

The prior art, for example in *"Oxygen in Silicon"* F. Shimura, *Semiconductors and Semimaterials* Vol. 42, Academic Press, San Diego, 1994, has disclosed how the outdiffusion of the oxygen near the surface is achieved in a heat treatment at temperatures of preferably over 1100° C. As a result of this outdiffusion, the concentration of oxygen in the layer close to the surface falls so far that there is no longer any precipitation, and consequently a PFZ is generated. This heat treatment was in most cases directly integrated into the processes for producing components. In modern processes, however, these high temperatures are no longer used, and consequently the required outdiffusion is brought about by an additional heat-treatment step.

The oxygen precipitation, in particular in crucible-pulled semiconductor material, takes place substantially in two steps:

1) formation of nucleation centers for oxygen precipitates, so-called nuclei;
2) growth of these centers to form detectable oxygen precipitates.

During subsequent heat treatments, the size of these nuclei can be modified in such a way that those which have a larger radius than the so-called "critical radius" grow into oxygen precipitates. On the other hand, nuclei with a smaller radius break down (are dissolved). The growth of nuclei with a radius >$r_c$ takes place at elevated temperature and is substantially limited by the diffusion of oxygen. A generally accepted model (cf., for example, Vanhellemont et al., *J. Appl. Phys.* 62, p. 3960, 1987) describes the critical radius $r_c$ as a function of the temperature, the oxygen supersaturation and the concentration of vacancies. Concentration is understood to mean particles per unit volume.

A high oxygen concentration and/or a high vacancy supersaturation simplifies or accelerates the precipitation of oxygen and leads to a higher concentration of precipitates. Furthermore, the concentration or size of the precipitates, in particular in semiconductor wafers, depends on heating and cooling rates during thermal furnace processes, in particular during the so-called RTA (rapid thermal annealing) processes. During these heat treatments, semiconductor wafers are heated to temperatures of up to 1300° C. within a few seconds and are then cooled at rates of up to 300° C./sec.

The oxygen concentration, the vacancy concentration, the interstitial concentration, the dopant concentration and the concentration of existing precipitation nuclei, such as for example carbon atoms, also influence the precipitation of oxygen.

WO 98/38675 has disclosed a semiconductor wafer with an uneven distribution of crystal lattice vacancies, which is obtained by means of a heat treatment. The maximum level of this vacancy profile generated in this way is situated in the bulk of the semiconductor wafer, and the profile decreases considerably toward the surfaces. During subsequent heat-treatment processes, in particular at 800° C. for 3 h and 1000° C. for 16 h, the oxygen precipitation follows this profile. The result is a PFZ without prior outdiffusion of the oxygen and oxygen precipitates in the bulk of the semiconductor wafer.

According to WO 98/38675, the concentration of oxygen precipitates is set by means of the concentration of vacancies, and the depth of the precipitates is set by means of the cooling rate following the heat treatment. A drawback of this semiconductor wafer is that the getter centers are limited to the bulk. Furthermore, very high BMD (bulk micro defect) concentrations lead to high leakage currents from integrated circuits when these circuits are located close to the layer relevant for the components. These leakage currents can be minimized if regions with very high BMD concentrations are produced as far away from the components as possible. Furthermore, it has been found that, in particular for applications in micromechanics, high BMD concentrations in the middle of the semiconductor wafer have an adverse effect on the selective etching behavior. This is because a high variation in etching removal rates is observed in the presence of the precipitates. Consequently, it is desired to limit the oxygen precipitates as far as possible to defined layers. It is also desired to keep the back-side part of the semiconductor wafer precipitate-free, for example for the production of micromechanical structures.

SUMMARY OF THE INVENTION

It is therefore an object of the present invention to provide a semiconductor wafer, and a process for producing the wafer, which serves as a basis for a semiconductor wafer with an improved internal gettering action.

This above object is achieved according to the invention by means of a semiconductor wafer having a front side 1, a back side 2, a top layer 3, a bottom layer 4, an upper inner layer 5 lying below the top layer 3, a lower inner layer 6 lying above the bottom layer 4, a central region 7 between the layers 5 and 6 and an uneven distribution of crystal lattice defects. The concentration of the defects exhibits a first maximum ($max_1$) in the central region 7 and a second maximum ($max_2$) in the bottom layer 4.

The defects are preferably vacancies which are converted into nucleation centers for oxygen precipitates during subsequent heat treatment processes, preferably at temperatures of from 300° C. to 800° C. According to the invention, the nucleation centers follow the profile of the vacancies. Preferably, the concentration of the defects increases from the front side 1 of the semiconductor wafer toward the central region 7, up to the first maximum ($max_1$), and toward the bottom layer 4, up to the second maximum ($max_2$).

Accordingly, the above object is also achieved by means of a semiconductor wafer with an uneven distribution of nucleation centers for oxygen precipitates.

In particular, the object is also achieved by means of a semiconductor wafer having a front side 1, a back side 2, a top layer 3, a bottom layer 4, an upper inner layer 5 lying below the top layer 3, a lower inner layer 6 lying above the bottom layer 4, a central region 7 between the layers 5 and 6 and an uneven distribution of nucleation centers for oxygen precipitates. The concentration of the nucleation centers exhibits a first maximum ($max_1$) in the central region 7 and a second maximum ($max_2$) in the bottom layer 4, and the concentration of the nucleation centers on the front side 1 and in the top layer 3 is so low that, in a subsequent heat treatment without outdiffusion of oxygen, a precipitate-free layer with a thickness of from 1 to 100 μm is formed on the front side 1.

Surprisingly, it has been found that the nucleation centers are not mobile point defects, but rather immobile deposits. According to the invention, therefore, the oxygen precipitation exactly follows this profile during subsequent heat treatments, for example during a heat treatment for 3 h at 780° C. and for 16 h at 1000° C.

Due to the variation in concentration of the nucleation centers at increasing distance from the surface of the semiconductor wafer, the subsequent heat treatment processes thus result in a depth-dependent variation in the concentration of the oxygen precipitates.

Accordingly, a semiconductor wafer whose concentration of nucleation centers is very low on the front side 1 and in the top layer 3, increases toward the central region, to a first maximum ($max_1$), and then rises again toward the back side 2, in order to reach a second maximum ($max_2$) in the bottom layer 4, is preferred. The second maximum is greater than the first maximum. The front side (1) is that side of the wafer on which electronic devices will be produced.

However, the object is also achieved by means of a semiconductor wafer having a front side 1, a back side 2, a top layer 3, a bottom layer 4, an upper inner layer 5 lying below the top layer 3, a lower inner layer 6 lying above the bottom layer 4, a central region 7 between the layers 5 and 6 and an uneven distribution of crystal lattice defects, wherein the concentration of the defects exhibits a maximum ($max_1$) in the upper inner layer 5.

The defects are preferably vacancies which are converted into nucleation centers for oxygen precipitates during subsequent heat treatment processes, preferably at temperatures of from 300° C. to 800° C. According to the invention, the nucleation centers follow the profile of the vacancies.

Accordingly, the object is also achieved by means of a semiconductor wafer with an uneven distribution of nucleation centers for oxygen precipitates.

In particular, the object is also achieved by means of a semiconductor wafer having a front side 1, a back side 2, a top layer 3, a bottom layer 4, an upper inner layer 5 lying below the top layer 3, a lower inner layer 6 lying above the bottom layer 4, a central region 7 between the layers 5 and 6 and an uneven distribution of nucleation centers for oxygen precipitates. The concentration of the nucleation centers exhibits a maximum ($max_1$) in the upper inner layer 5. The concentration of the nucleation centers on the front side 1, the back side 2, in the top layer 3, the bottom layer 4 and the lower inner layer 6 is so low that, in a subsequent heat treatment without outdiffusion of oxygen, precipitate-free layers with a thickness of from 1 to 100 μm are formed on the front side 1 and the back side 2.

According to the invention, therefore, the oxygen precipitation exactly follows this profile during subsequent heat treatments, for example during a heat treatment for 3 h at 780° C. and for 16 h at 1000° C.

The oxygen precipitates in particular in the upper inner layer 5 have proven advantageous, since the back-side region of precipitates remains clear and therefore offers ideal conditions for, for example, applications in micromechanics. Nevertheless, the precipitates formed in the layer 5 and in the central region 7 produce a good gettering action.

BRIEF DESCRIPTION OF THE DRAWINGS

Other objects and features of the present invention will become apparent from the following detailed description considered in connection with the accompanying drawings which disclose embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
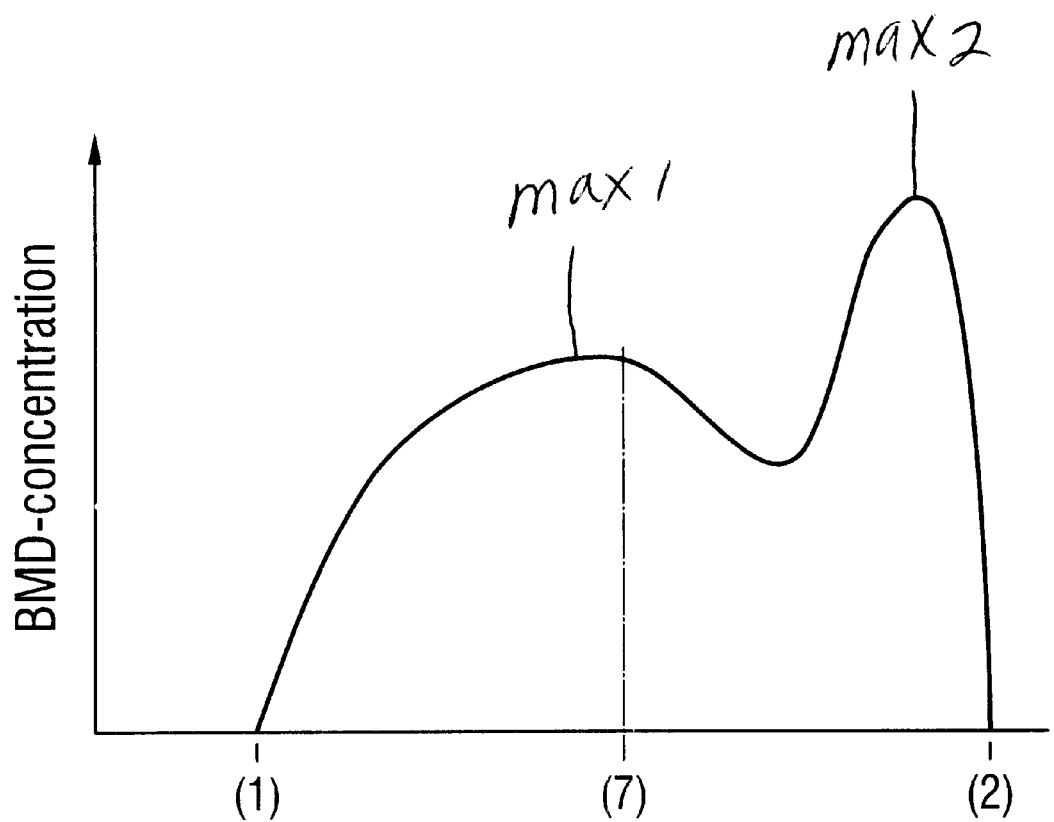
FIG. 1 shows one embodiment according to the invention in which the concentration of defects has a first maximum ($max_1$) and a second maximum ($max_2$)
Figure 2:
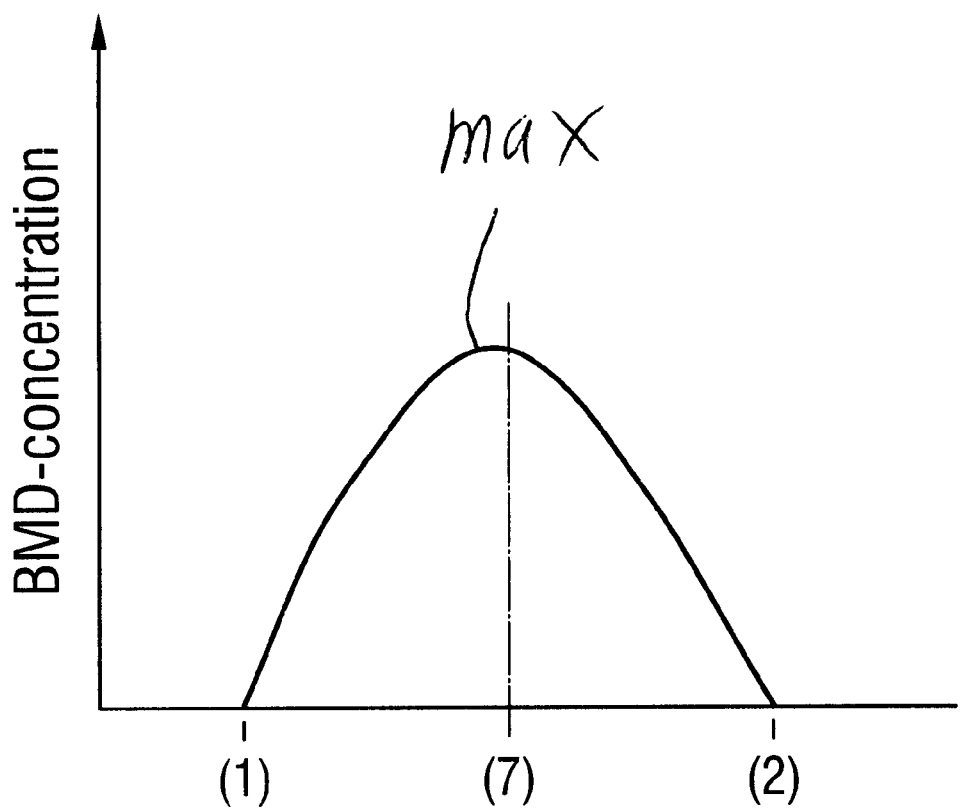
FIG. 2 shows another embodiment according to the invention in which the concentration of defects has a maximum in the upper inner layer.

According to the invention, the basis for a semiconductor wafer with improved internal gettering action is provided, in a semiconductor wafer, by a vacancy profile which has two maximums (illustrated by way of example in FIG. 1) or one maximum which is located between the front side 1 and the central region 7 of the semiconductor wafer (illustrated by way of example in FIG. 2). The nucleation centers exactly follow these profiles during subsequent heat treatment processes.

Figure 3:
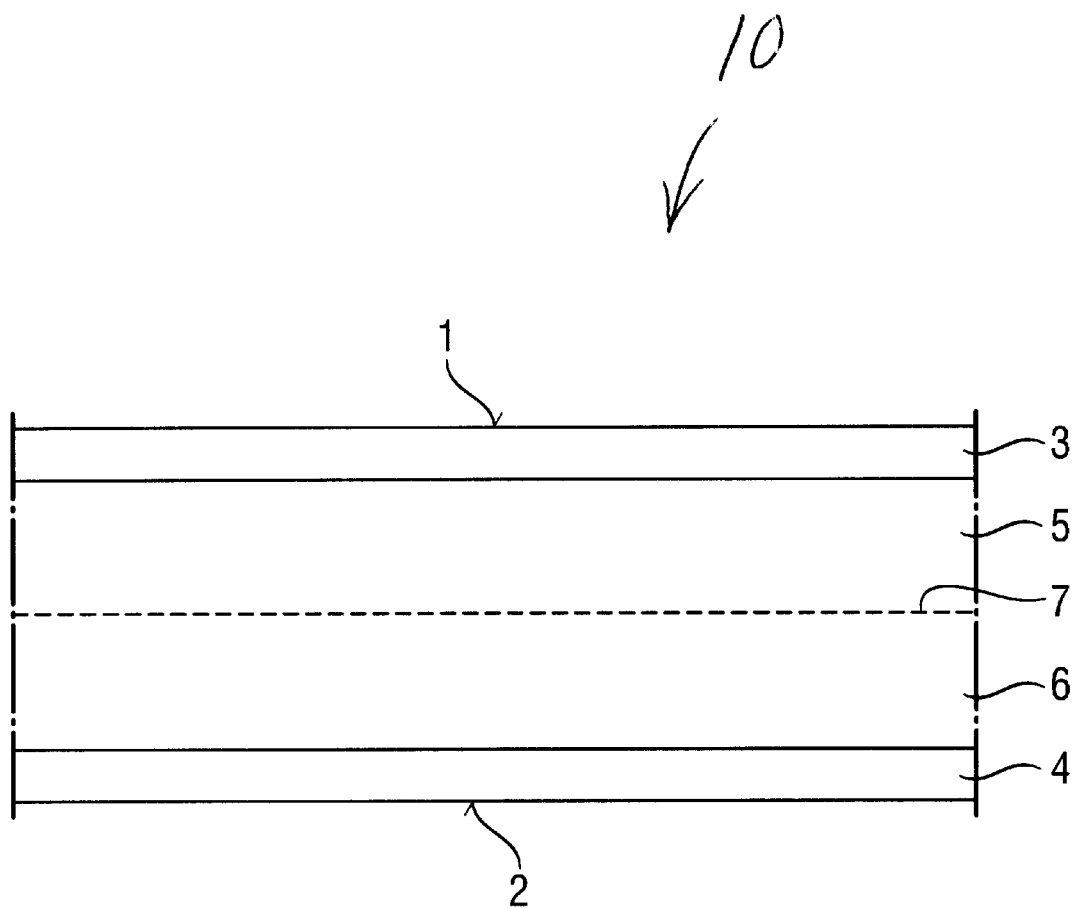
FIG. 3 shows a cross sectional view of a semiconductor wafer of the invention.

FIG. 3 shows the layers defined above as well as the front side 1, the back side 2 and the central region 7 between the layers 5 and 6 of a semiconductor wafer 10. The top layer 3 is preferably between 0 and 100 μm thick, the upper inner layer 5 is preferably between 15 and 330 μm thick, the lower inner layer 6 is preferably between 100 and 300 μm thick, and the bottom layer 4 is preferably between 0 and 250 μm thick.

The concentration of the nucleation centers on the front side is preferably less than $10^4$ $cm^{-3}$, and ideally the concentration approaches zero. At increasing distance from the front side 1 toward the central region 7, the concentration increases, then remains constant in that region or decreases again, before rising again toward the back side 2, without outdiffusion of oxygen taking place (FIG. 1). The profile shown in FIG. 2 is likewise converted into a corresponding profile of nucleation centers.

The figures indicate, by way of example, BMD concentrations without units. BMDs are to be understood as meaning, in general terms, crystal defects, such as for example vacancies or nucleation centers.

According to the invention, a precipitate-free layer with a thickness of preferably from 1 to 100 μm is obtained on that side of the semiconductor wafer which is active for the components, without complex oxygen outdiffusion steps having to be carried out.

Preferably, oxygen precipitates are formed in the upper inner layer 5, in the lower inner layer 6 and in the bottom layer 4 during the component production, ensuring an improved internal gettering action.

Furthermore, this special nucleation-center profile shown in FIG. 1 brings about improved gettering properties on the back side of the semiconductor wafer, since that is where the highest concentration of precipitates is to be found.

Preferably, oxygen precipitates form only in the upper inner layer 5 lying below the top layer 3. This ensures that the region with the highest precipitate concentration is situated furthest away from the layer which is relevant for components, so that the leakage current problem is minimized. This also allows any secondary defects formed from the oxygen precipitates, such as for example dislocations, to reach the front side 1, which is relevant for the components. Therefore, on the front side of the semiconductor wafer and in the layer beneath it there are no defects which can have an adverse affect on the integrated circuits.

Accordingly, the object of the invention is also achieved by means of a process for producing a semiconductor wafer with an uneven distribution of crystal lattice defects by means of a heat treatment at a temperature of from 800° C. to 1300° C. The front side of the semiconductor wafer is exposed to a process gas ($gas_1$) and the back side is exposed to a process gas ($gas_2$) during the heat treatment, with the proviso that $gas_1$ is not the same as $gas_2$, but is different from $gas_2$.

The heat treatment carried out on the semiconductor wafer preferably takes place in a lamp furnace with two reactor chambers. Furnaces of this nature are known, for example, from EP 0,675,524 A1 or EP 0,476,480 B1. Lamp furnaces also ensure rapid heating and cooling of the semiconductor wafer. The profile of the crystal lattice defects is frozen in particular by suitably rapid cooling. To achieve this, the cooling rates following the heat treatment of the semiconductor wafer are preferably between 1 and 300° C./s, particularly preferably between 100° C./s and 250° C./s, and in particular between 75° C./s and 200° C./s in the temperature range from 1300° C. to 800° C.

The concentration and depth of the defects are controlled by means of the cooling rates, temperature, duration of the heat treatment and the process gases used. For example, if the temperature increases, the concentration of defects rises, while a lowering of the cooling rate increases the PFZ width.

In the process for producing a semiconductor wafer with an uneven distribution of crystal lattice defects, in which the defect concentration exhibits a first maximum ($max_1$) in the central region 7 and a second maximum ($max_2$) in the bottom layer 4, the front side 1 of the semiconductor wafer is exposed to a, preferably inert, process gas ($gas_1$). This gas is preferably selected from a group of gases consisting of nitrogen, hydrogen and the inert gases, as well as any desired mixtures and any desired inert chemical compounds of the abovementioned gases. If appropriate, traces of oxygen may form up to 10% by volume.

The back side 2 of the semiconductor wafer is exposed to a, preferably nitriding, process gas ($gas_2$), which preferably comprises nitrogen or nitrogen compounds, such as for example ammonia, and, if appropriate, one or more inert carrier gases.

In the process for producing a semiconductor wafer with an uneven distribution of crystal lattice defects, in which the defect concentration exhibits a maximum ($max_1$) in the upper inner layer 5, the front side 1 of the semiconductor wafer is exposed to a, preferably inert, process gas ($gas_1$), which is preferably selected from a group of gases consisting of nitrogen, hydrogen and the inert gases, as well as any desired mixtures and any desired inert chemical compounds of the abovementioned gases. If appropriate, traces of oxygen may form up to 10% by volume.

The back side 2 of the semiconductor wafer is exposed to a, preferably oxidizing, process gas ($gas_2$), which preferably comprises oxygen or oxygen compounds, such as for example water, and, if appropriate, one or more inert carrier gases.

The semiconductor wafer with an uneven distribution of crystal lattice defects is converted into a semiconductor wafer with an uneven distribution of nucleation centers for oxygen precipitates by a subsequent heat treatment at temperatures of preferably 300 to 800° C.

Accordingly, the object of the invention is also achieved by means of a process for producing a semiconductor wafer with an uneven distribution of nucleation centers for oxygen precipitates, wherein a semiconductor wafer with an uneven distribution of crystal lattice defects is subjected to a heat treatment at a temperature of between 300 and 800° C.

The duration of the heat treatment is preferably between 1 and 360 min, particularly preferably between 30 and 240 min, and in particular between 60 and 180 min. The heat treatment is preferably carried out in a process gas atmosphere. The process gas is preferably selected from a group of gases consisting of oxygen, nitrogen, hydrogen and the inert gases, as well as any desired mixtures and any desired chemical compounds of the abovementioned gases.

According to the invention, a profile of nucleation centers for oxygen precipitates which is distinguished by a concentration first maximum ($max_1$) in the central region 7 and a concentration second maximum ($max_2$) in the bottom layer 4 is generated in the semiconductor wafer. The second maximum is greater than the first maximum.

According to the invention, a profile of nucleation centers for oxygen precipitates which is distinguished by a concentration maximum ($max_1$) in the upper inner layer 5 is also generated in the semiconductor wafer.

By means of profiles of this nature, a precipitate-free layer with a thickness of from 1 to 100 μm is generated on the front side 1 during a subsequent heat treatment process, without outdiffusion of oxygen being required. The concentration of the oxygen precipitates in the layers 5 and 6 is preferably set by means of the conditions during the formation of the nucleation centers, in particular the temperature and the time and the duration of the heat treatment in a temperature range of preferably from 800° C. to 1300° C.

Accordingly, while a few embodiments of the present invention have been shown and described, it is to be understood that many changes and modifications may be made thereunto without departing from the spirit and scope of the invention as defined in the appended claims.

What is claimed is:

1. A semiconductor wafer comprising
   a front side (1), a back side (2), a top layer (3), a bottom layer (4), an upper inner layer (5) lying below the top layer (3), a lower inner layer (6) lying above the bottom layer (4), a central region (7) between layers (5) and (6) and
   said front side being that side of the wafer on which electronic devices will be produced; and
   an uneven distribution of crystal lattice defects, wherein the concentration of the defects exhibits a first maximum ($max_1$) in the central region (7) and a second maximum ($max_2$) in the bottom layer (4); and
   wherein the second maximum is greater than the first maximum.

2. The semiconductor wafer as claimed in claim 1,
   wherein the concentration of the defects increases from the front side (1) toward the central region (7), up to the first maximum ($max_1$), and the concentration of defects increases toward the bottom layer (4), up to the second maximum ($max_2$).

3. The semiconductor wafer as claimed claim 1,
   wherein the crystal lattice defects are vacancies.

4. A semiconductor wafer comprising
   a front side (1), a back side (2), a top layer (3), a bottom layer (4), an upper inner layer (5) lying below the top layer (3), a lower inner layer (6) lying above the bottom layer (4), a central region (7) between layers (5) and (6);
   said front side being that side of the wafer on which electronic devices will be produced; and
   an uneven distribution of crystal lattice defects, wherein the concentration of the defects exhibits a maximum ($max_1$) in the upper inner layer (5); and
   wherein the concentration of the defects increases from the front side (1) of the semiconductor wafer toward the upper inner layer (5).

5. The semiconductor as claimed in claim 4,
   wherein the crystal lattice defects are vacancies.

6. A semiconductor wafer comprising
   a front side (1), a back side (2), a top layer (3), a bottom layer (4), an upper inner layer (5) lying below the top layer (3), a lower inner layer (6) lying above the bottom layer (4), a central region (7) between layers (5) and (6); and
   said front side being that side of the wafer on which electronic devices will be produced; and
   an uneven distribution of nucleation centers for oxygen precipitates, wherein the concentration of the nucleation centers exhibits a first maximum ($max_1$) in the central region (7) and a second maximum ($max_2$) in the bottom layer (4); and
   wherein the second maximum is greater than the first maximum; and
   the concentration of the nucleation centers on the front side (1) and in the top layer (3) is so low that, in a subsequent heat treatment without outdiffusion of oxygen, a precipitate-free layer with a thickness of from 1 to 100 $\mu$m is formed on the front side (1).

7. A semiconductor wafer comprising
   a front side (1), a back side (2), a top layer (3), a bottom layer (4), an upper inner layer (5) lying below the top layer (3), a lower inner layer (6) lying above the bottom layer (4), a central region (7) between layers (5) and (6); and
   said front side being that side of the wafer on which electronic devices will be produced; and
   an uneven distribution of nucleation centers for oxygen precipitates, wherein the concentration of the nucleation centers exhibits a maximum ($max_1$) in the upper inner layer (5); and
   the concentration of the nucleation centers on the front side (1), the back side (2), in the top layer (3), the bottom layer (4) and the lower inner layer (6) is so low that, in a subsequent heat treatment without outdiffusion of oxygen, precipitate-free layers with a thickness of from 1 to 100 $\mu$m are formed on the front side (1) and the back side (2).

* * * * *

UNITED STATES PATENT AND TRADEMARK OFFICE
CERTIFICATE OF CORRECTION

PATENT NO.    : 6,579,589 B1
DATED         : June 17, 2003
INVENTOR(S)   : Obermeier et al.

It is certified that error appears in the above-identified patent and that said Letters Patent is hereby corrected as shown below:

<u>Title page,</u>
Item [73], Assignee, should read -- Wacker Siltronic Gesellschaft für Halbleitermaterialien AG, Burghausen (DE) --

Signed and Sealed this

Twenty-seventh Day of January, 2004

JON W. DUDAS
*Acting Director of the United States Patent and Trademark Office*